United States Patent [19]

Abe et al.

[11] Patent Number: 4,610,079
[45] Date of Patent: Sep. 9, 1986

[54] METHOD OF DICING A SEMICONDUCTOR WAFER

[75] Inventors: Masahiro Abe, Yokohama; Masafumi Miyagawa, Sagamihara; Hatsuo Nakamura, Yokohama; Toshio Yonezawa, Yokosuka, all of Japan

[73] Assignee: Tokyo Shibaura Denki Kabushiki Kaisha, Kawasaki, Japan

[21] Appl. No.: 705,844

[22] Filed: Feb. 26, 1985

Related U.S. Application Data

[63] Continuation of Ser. No. 513,255, Jul. 13, 1983, abandoned, which is a continuation of Ser. No. 223,303, Jan. 8, 1981, abandoned.

[30] Foreign Application Priority Data

Jan. 22, 1980 [JP] Japan ................................ 55-6079

[51] Int. Cl.⁴ .......................................... H01L 21/304
[52] U.S. Cl. .......................................... 29/583; 29/580; 29/581; 29/582; 29/413; 29/414; 148/DIG. 28
[58] Field of Search ................. 29/413, 414, 550, 581, 29/582, 583

[56] References Cited

U.S. PATENT DOCUMENTS

| 3,608,186 | 9/1971 | Hutson | 29/583 |
| 3,628,106 | 12/1971 | Frank et al. | 357/52 |
| 3,628,107 | 12/1971 | Kennedy | 357/52 |
| 3,852,876 | 12/1974 | Sheldon et al. | 29/583 |
| 3,972,113 | 8/1976 | Nakata et al. | 29/583 |
| 4,033,027 | 7/1977 | Fair et al. | 29/583 |
| 4,040,877 | 8/1977 | Johnson et al. | 29/583 X |
| 4,096,619 | 6/1978 | Cook | 29/413 |
| 4,135,291 | 1/1979 | Tursky et al. | 29/583 X |
| 4,179,794 | 12/1979 | Kosugi et al. | 29/583 X |
| 4,217,689 | 8/1980 | Fujii et al. | 29/413 |
| 4,236,296 | 12/1980 | Woolhouse et al. | 29/583 |
| 4,237,601 | 12/1980 | Woolhouse et al. | 29/569 L |
| 4,259,682 | 3/1981 | Gamo | 357/55 |
| 4,355,457 | 10/1982 | Barlett et al. | 29/583 |

FOREIGN PATENT DOCUMENTS

| 0124243 | 9/1980 | Japan | 29/414 |
| 1118536 | 7/1968 | United Kingdom . | |

Primary Examiner—Brian E. Hearn
Assistant Examiner—Hunter L. Auyang
Attorney, Agent, or Firm—Cushman, Darby & Cushman

[57] ABSTRACT

A method of dicing a semiconductor wafer in which a physical discontinuity is formed on the surface of the wafer on both sides of a dicing line to limit the spreading of cracks and chips generated during dicing. Thereafter, the semiconductor wafer is diced to separate the pellets.

3 Claims, 12 Drawing Figures 4,610,079

METHOD OF DICING A SEMICONDUCTOR WAFER

This is a continuation of application Ser. No. 513,255, filed July 13, 1983, which was abandoned upon the filing hereof, and which was a contination of Ser. No. 223,303, filed Jan. 8, 1981, now abandoned.

BACKGROUND OF THE INVENTION

This invention relates to a method of dicing a semiconductor wafer.

With most semiconductor products, for example, transistors, diodes, light emitting diodes, and integrated circuits, a large number of elements are manufactured simultaneously on a large semiconductor wafer of Si, GaP, GaAs, saphire, etc. The semiconductor industry employs the term "dicing technologies" to refer to those techniques for obtaining a large number of high quality pellets from each semiconductor wafer. Two dicing methods are particularly well known in the art. These are the grinding-cutting method, using a blade or wire saw, and the scribing method, using a diamond point. When laying out the pattern of pellets on the surface of the semiconductor wafer, the distance between adjacent pellets has been minimized to maximize efficiency.

However, three restrictions exist with respect to the minimum distance permissible between adjacent pellets. The first restriction is the actual dicing width, the second restriction is the degree of precision to which the cutting machine can be adjusted, and the third restriction is the cracks and chips extending horizontally from the dicing line. Of these restrictions, the third, namely the generation of cracks and chips, creates the most significant limitation with respect to minimizing the distance between adjacent pellets.

FIG. 1($a$) illustrates the product of the traditional grinding-cutting method, and FIG. 1($b$) illustrates the product of the traditional scribing method. Similar elements in these FIGURES are assigned the same reference numbers. A semiconductor substrate 11 carries many active element areas such as 12, 13 (not shown in detail), and dicing occurs in the space between the adjacent active element areas 12, 13. Many cracks and chips 14 are generated horizontally from a dicing line 15. Therefore, the distance between active element areas 12, 13 (shown in FIGS. 1($a$) and 1($b$) as distance A—A) has to be 100–200 $\mu$m to prevent the active element areas 12, 13 from being influenced by cracks and chips 14.

OBJECT AND SUMMARY OF THE INVENTION

An object of this invention is to provide an improved method of dicing the semiconductor wafer to prevent cracks and chips along the dicing line from spreading to the active areas.

The method of dicing the semiconductor wafer according to this invention includes the step of forming a physical discontinuity on the surface of the wafer on both sides of a predetermined dicing line. The semiconductor wafer is then diced into pellets.

BRIEF DESCRIPTION OF THE DRAWINGS

This and other objects and advantages of the invention will become more apparent and more readily appreciated from the following detailed description of the presently preferred exemplary embodiment of the invention taken in conjunction with the accompanying drawings, of which.

DETAILED DESCRIPTION OF THE PREFERRED EMBODIMENTS

This invention is based on the discovery that cracks and chips which are generated during dicing are transmitted in a direction perpendicular to the direction of maximum stress in the wafer. Thus, typically, cracks spread away from the dicing line into the wafer. However, in this invention, this transmission is restrained by the formation of a stress concentration in the path of the crack. Namely, the transmission of the cracks and chips is restrained by the formation of a physical discontinuity on the surface of the wafer on both sides of a predetermined dicing line.

Figure 1A:
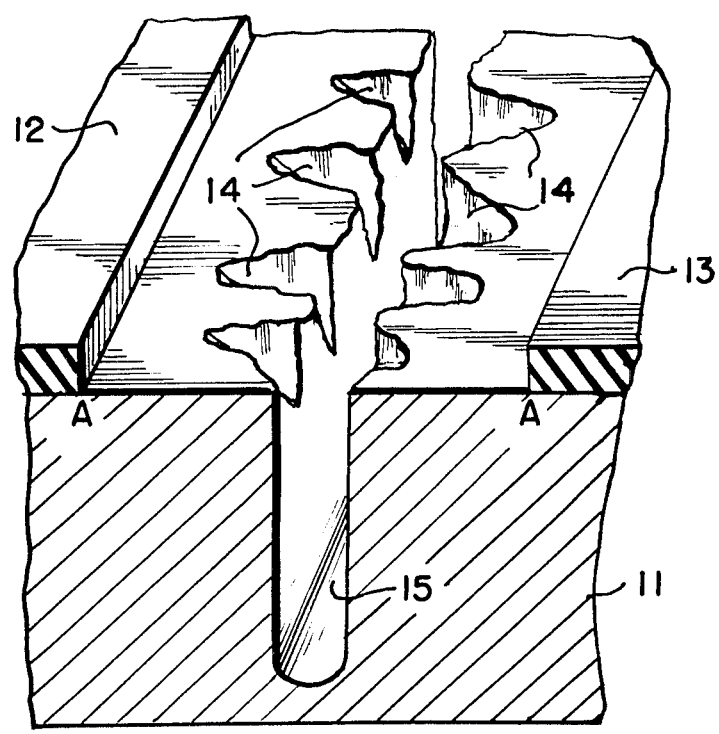
FIGS. 1($a$) and ($b$) are perspective, expanded, partly sectional views of a device manufactured by conventional techniques.
Figure 1B:
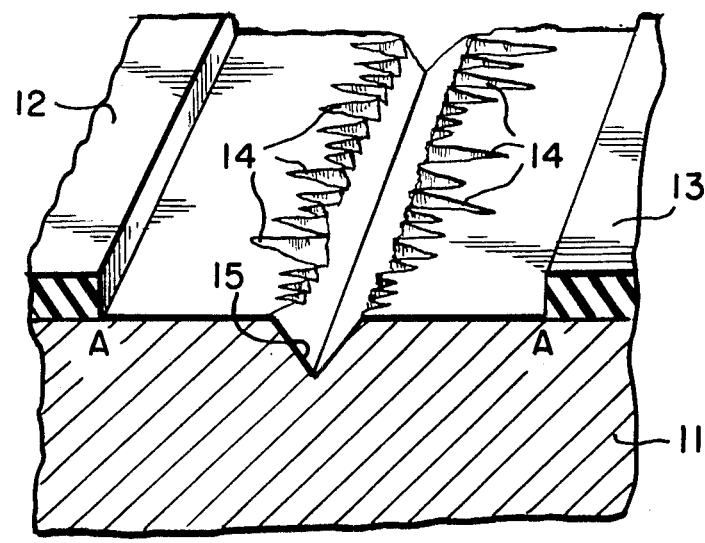
Figure 2A:
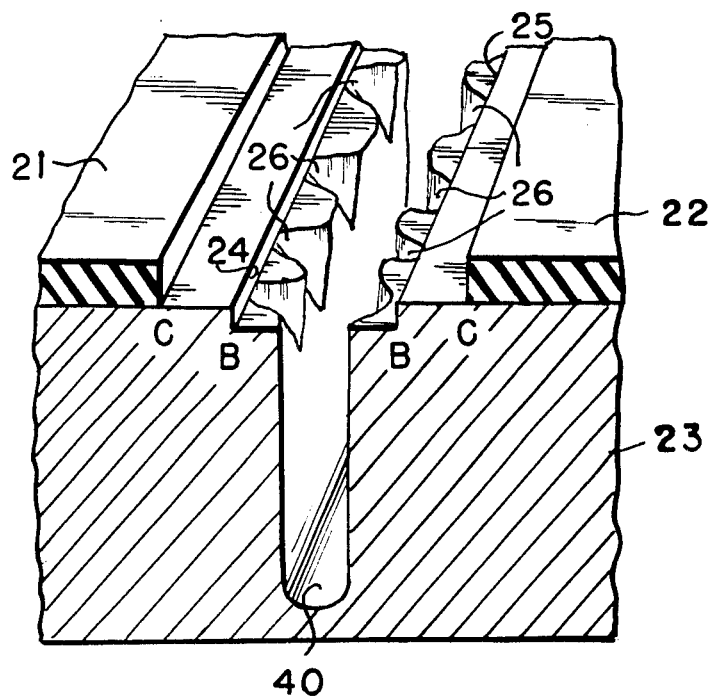
FIGS. 2($a$) and ($b$) are perspective, expanded, partly sectional views of devices manufactured by two embodiments of this invention.
Figure 2B:
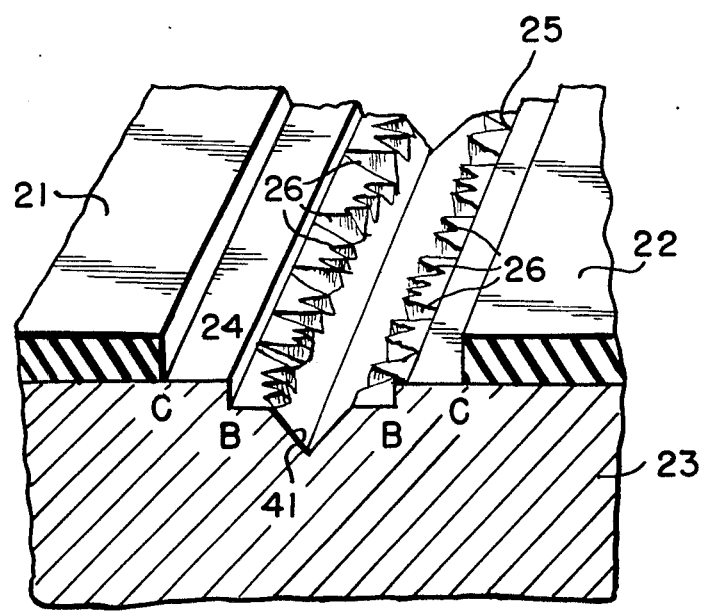

Referring now to the drawing wherein like reference characters designate like or corresponding parts throughout the several views, FIGS. 2($a$) and 2($b$) illustrate products of this invention, with FIG. 2($a$) illustrating the product of the grinding-cutting method and FIG. 2($b$) illustrating the product of the scribing method. Active element areas 21, 22 are formed on a substrate 23 and many circuit elements (not shown) are manufactured in these areas. A change in the level of the surface of substrate 23, specifically a groove defined by walls 24, 25, is formed over a predetermined cutting line on the surface of substrate 23. The distance between walls 24, 25 (shown in FIGS. 2($a$) and 2($b$) as distance B—B) is 60 $\mu$m, and the height of walls 24, 25 is 3 $\mu$m. The groove defined by walls 24, 25 should not be made mechanically, but by chemical photo-etching or any other non-mechanical method. Thereafter substrate 23 is ground or scribed along the predetermined line to form deep separation 40 in FIG. 2($a$) or shallow separation 41 in FIG. 2($b$), respectively. As the result of this invention, the transmission of the cracks and chips 26 is stopped at walls 24, 25. Therefore, it is possible to reduce the distance between the active element areas to 80–100 $\mu$m (shown as distance C—C in FIGS. 2($a$), 2($b$)).

Figure 3:
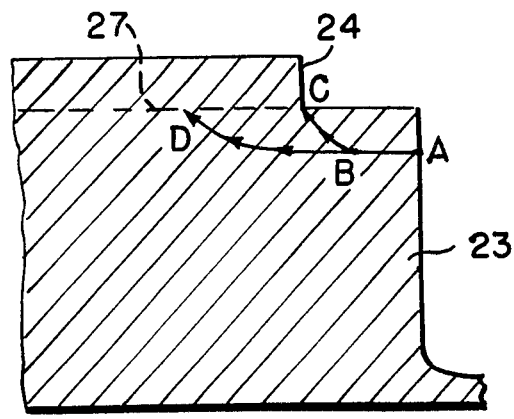
FIGS. 3 to 5, inclusive, are expanded, sectional views, respectively, showing the principles of this invention and devices manufactured by other embodiments of this invention.

FIG. 3 illustrates the path of cracks and chips into substrate 23 with respect to the cutting-grinding embodiment of this invention. A crack generated at point A spreads via point B to point C where wall 24 stops the spreading. If wall 24 had not been there, the crack would have extended to point D along dotted line 27. The reason the crack stops at point C is as follows. The crack generated at the point A will tend to spread perpendicular to the direction of the main stress, that is into the substrate, roughly parallel to the surface. When the front of the crack reaches point B, wall 24 causes the concentration of stress to occur between point B and point C. Thus the crack tends to change direction and proceed to the surface, stopping at point C.

Figure 4:
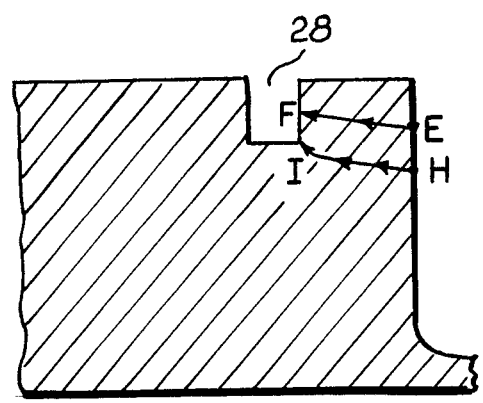
Figure 5:
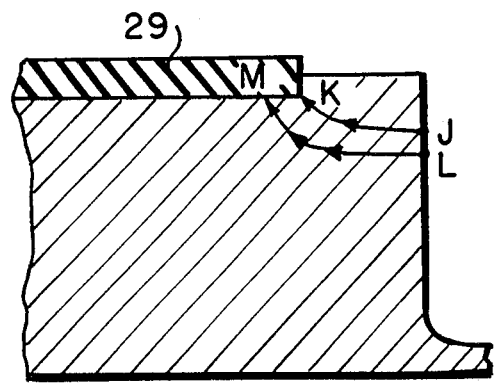

In another embodiment of this invention, as shown in FIG. 4, a surface level change, specifically a groove 28 is created to concentrate the stress. Cracks generated at the point E and H spread to points F and I, respectively, and stop. Groove 28 may have a depth of 3 or 4 μm. FIG. 5 shows another embodiment of this invention, which includes the step of forming a semiconductor oxide film 29 on and partially into the substrate to create a surface level change. For cracks generated at points J and L, the stress concentrations happen between points K and M, respectively, so that the cracks are restrained at points K and M.

Figure 6:
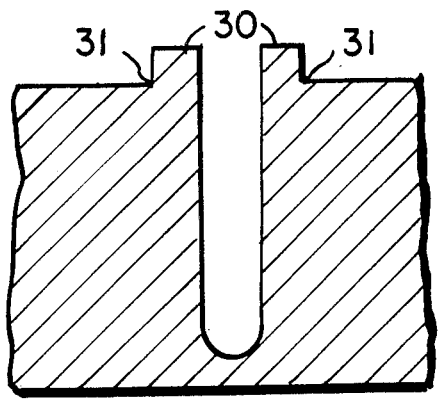
FIGS. 6 to 10, inclusive, are expanded, partly sectional views of devices manufactured by still other embodiments of this invention.
Figure 7:
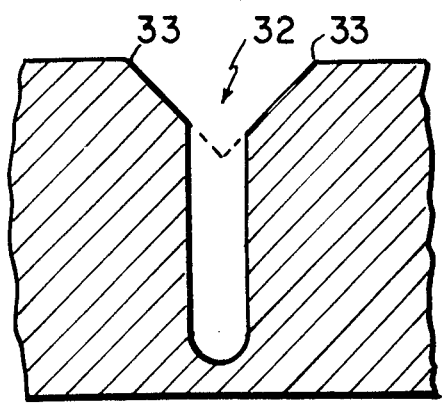
Figure 8:
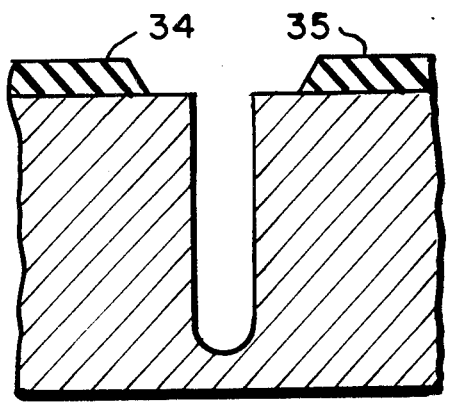
Figure 9:
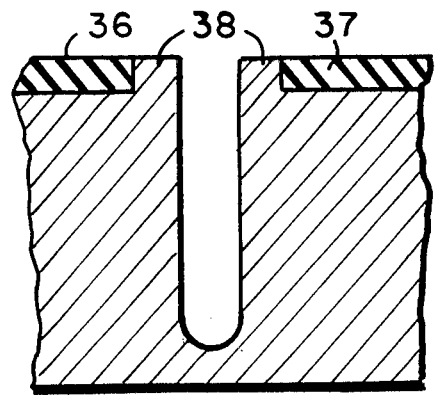
Figure 10:
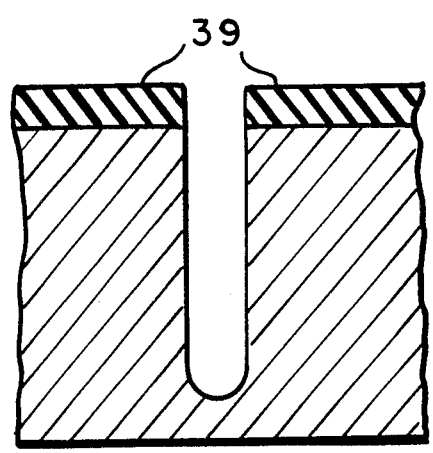

FIGS. 6 to 10 illustrate the product of other embodiments of this invention. Referring to FIG. 6, a surface level change, specifically a protuberance 30 is formed on the surface along and extending beyond the predetermined dicing line. Cracks are restrained at walls 31. In FIG. 7, a V-shaped notch 32 is formed over the predetermined dicing line, and cracks are restrained at edges 33 of notch 32, which edges are a surface level change. In FIG. 8, oxide films 34,35 are formed on the surface, on both sides of the dicing line. Cracks are restrained at the edges of these oxide filxs. FIG. 9 illustrates the product of another embodiment of this invention, which combines the embodiments shown in FIGS. 6 and 8. Oxide films 36, 37 are formed beside protuberance 38, and cracks are restrained more certainly by these stress concentration portions. In FIG. 10, a uniform thermal oxide film 39 is formed on the surface of the substrate including the predetermined dicing line and adjacent thereto. Almost all of the cracks from the dicing operation are transmitted into oxide film 39, so that the substrate is not influenced. The thickness of oxide film 39 is preferably 200-600 Angstroms to ensure that the substrate is not disturbed.

In the above-mentioned embodiments of this invention, the physical discontinuities must be formed on both sides of the predetermined dicing line. Therefore, cracks and chips are restrained and stopped by the above-mentioned physical discontinuities. The different materials used as the physical discontinuities are suitable films having good adhesion and affinity characteristics, for example, thermal oxide film, nitride film and metal film.

Many changes and modifications in the above-described embodiments can, of course, be carried out without departing from the scope of the present invention, that scope being defined only by the scope of the appended claims.

What is claimed is:

1. A method of preparing a semiconductor wafer for dicing along a predetermined dicing line, comprising the steps of:
    forming a groove on a surface of said wafer, said groove straddling said dicing line and substantially preventing the spread of cracks from said dicing line, said groove having a width of substantially 60 μm and a height; and
    forming a scribe line in said semiconductor wafer along said dicing line, said scribe line being deeper than the height of said groove and less than the thickness of said wafer, said scribe line being narrower than the width of said groove to limit said cracks to propagation substantially within said groove width to allow for dense packing of active element areas on said wafer.

2. The method according to claim 1, wherein said physical discontinuity forming step includes the step of non-mechanically removing a portion of said wafer to form said discontinuity.

3. A method of dicing a semiconductor wafer comprising the steps of:
    nonmechanically forming a groove in said semiconductor wafer, said groove having a width and a vertical distance, said width being substantially equal to 60 μm;
    mechanically forming a scribe line in said semiconductor wafer through said groove, said scribe line having a depth greater than said vertical distance, and a width less than said groove width to cause cracks to be stopped substantially within said groove width to permit dense packing of active element areas on said wafer; and
    breaking said semiconductor wafer along said scribe line.

* * * * *